(12) United States Patent
Hsieh et al.

(10) Patent No.: US 7,341,358 B2
(45) Date of Patent: Mar. 11, 2008

(54) ILLUMINATION APPARATUS

(75) Inventors: Min-Hsun Hsieh, Hsinchu (TW);
Chou-Chih Yin, Hsinchu (TW);
Chun-Chang Chen, Hsinchu (TW);
Jen-Shui Wang, Hsinchu (TW);
Chia-Fen Tsai, Hsinchu (TW);
Yi-Ming Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 105 days.

(21) Appl. No.: 11/229,761

(22) Filed: Sep. 20, 2005

(65) Prior Publication Data
US 2006/0077685 A1 Apr. 13, 2006

(30) Foreign Application Priority Data
Sep. 24, 2004 (TW) .............................. 93129157 A
May 6, 2005 (TW) .............................. 94114630 A

(51) Int. Cl.
*G09F 13/04* (2006.01)
(52) U.S. Cl. ....................................... 362/97
(58) Field of Classification Search ................ 362/520, 362/606, 307, 627, 97
See application file for complete search history.

(56) References Cited
U.S. PATENT DOCUMENTS

| | | | |
|---|---|---|---|
| 6,582,103 B1 * | 6/2003 | Popovich et al. | ........... 362/307 |
| 6,598,998 B2 | 7/2003 | West et al. | |
| 6,623,150 B2 * | 9/2003 | Roller et al. | ............... 362/520 |
| 6,752,505 B2 * | 6/2004 | Parker et al. | ............... 362/627 |
| 7,226,196 B2 * | 6/2007 | Parker et al. | ............... 362/606 |
| 7,246,931 B2 * | 7/2007 | Hsieh et al. | ............... 362/612 |

FOREIGN PATENT DOCUMENTS

CN 1510482 A 7/2004

* cited by examiner

*Primary Examiner*—Sandra O'Shea
*Assistant Examiner*—James W Cranson, Jr.
(74) *Attorney, Agent, or Firm*—Rabin & Berdo, PC

(57) ABSTRACT

An illumination apparatus is disclosed in the invention. The illumination apparatus includes a cavity with a diffusion surface, a light source, a light-spreading device, and at least one optically-conditioning surface with a wavelike array formed thereon. The light-spreading device and the optically-conditioning surface spread the light generated by the light source. The light-spreading device includes a wing-shaped protrusion part, a light incident surface, a recess located away from the light incident surface, and an optically-conditioning surface including a wavelike array, wherein the wavelike array has a wavefront direction.

43 Claims, 7 Drawing Sheets

ILLUMINATION APPARATUS

RELATED APPLICATIONS

The present application claims the right of priority based on Taiwan Application Serial Number 93129157, filed Sep. 24, 2004; and Taiwan Application Serial Number 94114630, filed May 6, 2005, the disclosures of which are incorporated herein by reference in their entireties.

FIELD OF THE INVENTION

The present invention relates to an illumination apparatus, and more particularly to a planar illumination apparatus having a light-spreading device.

BACKGROUND OF THE INVENTION

A liquid crystal display (LCD) is a non-self emitting display, i.e. it needs a self-emitting device to serve as a light source. Such a light source is generally called a backlight module. There are usually two types of backlight modules: a direct-light type and an edge-light type. A direct-light type backlight module conventionally includes components such as cold cathode tubes that serve as the light sources, a diffuser, a prism sheet, etc. In order to evenly distribute light emitted from the light sources and provide a desired illumination field for an LCD, a deliberated control of the spaces/pitches between the light sources, the distance between the light sources and the diffuser, and distance between the light sources and the prism sheet is needed. However, due to the optical complexity in a backlight module, it is usually difficult to create a uniform illumination in LCDs. In addition to the aforementioned components in the direct-light type backlight module, an edge-light type backlight module further includes a light guide plate for guiding and/or diffusing light from the light sources. Nevertheless, the difficulty to create a uniform illumination still exists in the edge light type backlight module. Besides, the components forming the aforementioned two types of backlight modules are too complicated and therefore constitute an obstacle to reducing the production cost.

In order to overcome the aforementioned problems, U.S. Pat. No. 6,598,998 discloses a side light-emitting diode (LED) including an LED and a lens directing light from the LED to the side of the lens, i.e., to the direction substantially perpendicular to that of light emitted from the LED. The lens includes a sawtooth portion and a funnel-shaped portion for redirecting the light. However, the two portions are too large in scale and thereby increase the total thickness of the lens. Furthermore, such a lens needs to be mounted to each LED. Therefore the processing complexity and production cost for manufacturing LEDs are increased, and the light extraction efficiency of such a side LED is reduced to a certain extent, usually more than 10%.

U.S. Pat. No. 6,582,103 discloses a light source apparatus including a cavity having reflective surfaces and an output area, wherein at least one light source is disposed in the cavity, the light source comprising a point source and an optical diverter. The optical diverter is used to redirect the light emitted from the point source laterally or downwardly to the cavity having the reflective surfaces, thereby increases brightness and light-mixing performance. A diffuser is located within or over the output area. Despite the '103 patent may avoid the non-uniform illumination occurred in the backlight modules, an optical diverter is needed to mount to each light source, so that the overall packaging process is complicated and costly. Moreover, since each point source is in operation with a corresponding independent optical diverter, a light spot is apt to be formed. Thus, the thickness of the backlight module has be increased for enhancing the light-mixing performance, but the brightness decreases with the increase of the distances between the light sources, so that the spatial arrangement of the light sources has to be deliberately controlled in order to maintain the illumination uniformity of the backlight module.

The aforementioned patent arts are characterized in common by adding a lens or a light-guiding device to each point source, and may cause five problems: (1) complicated process; (2) high packaging cost; (3) increased backlight module thickness; (4) uneasily-controlled illumination uniformity of the entire backlight module; and (5) poor light extraction efficiency.

SUMMARY OF THE INVENTION

In view of the aforementioned problems occurred in prior art, the present invention discloses an illumination apparatus comprising a cavity having a diffusion surface and a light-output area; a light source for emitting light; a light-spreading device disposed in the cavity, the light-spreading device having a wing-shaped protrusion part, a light incident surface and a recess, wherein the recess is located away from the light incident surface and used for substantially guiding the light towards the wing-shaped protrusion part; and a first optically-conditioning surface located in a path that the light moves, the first optically-conditioning surface having a first wavelike array. The diffusion surface substantially is a Lambertian surface, and the light source can be a point source or a semiconductor light-emitting apparatus, and the light source includes one or more than one light-emitting apparatus, wherein at least two of the light-emitting apparatuses emit lights in different colors. White light is generated by one single light source or the combination of several light-emitting apparatuses. The recess is a substantial V-shape or U-shape.

The illumination apparatus of the present invention further comprises an optical film having a first surface and a second surface opposite to the first surface, wherein the first optically-conditioning surface is formed on the first surface. The optical film optionally comprises a second optically-conditioning surface formed on the second surface. The second optically-conditioning surface has a second wavelike array formed in a direction different from that of the first wavelike array. The optical film is disposed to cover the light-output area, and the first optically-conditioning surface is formed on the light incident surface, the surface of the light-spreading device, or within the light-spreading device.

The illumination apparatus of the present invention further comprises a light-collecting element located between the light source and the light-spreading device for collecting light emitted from the light source, wherein the first optically-conditioning surface may be formed on the light-collecting element, and the first optically-conditioning surface may face the light source or the light-spreading device. The light-collecting element optionally comprises a trench used for adapting the light source. Moreover, the illumination apparatus of the present invention further comprises a light-transmitting element for transmitting light to the light-spreading device, wherein the light-transmitting element is preferably an optical fiber, a light pipe, or similar device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, the features of the present invention are explained by referring to the related figures, in accordance with preferred embodiments of the present invention.

First Embodiment

Figure 1A:
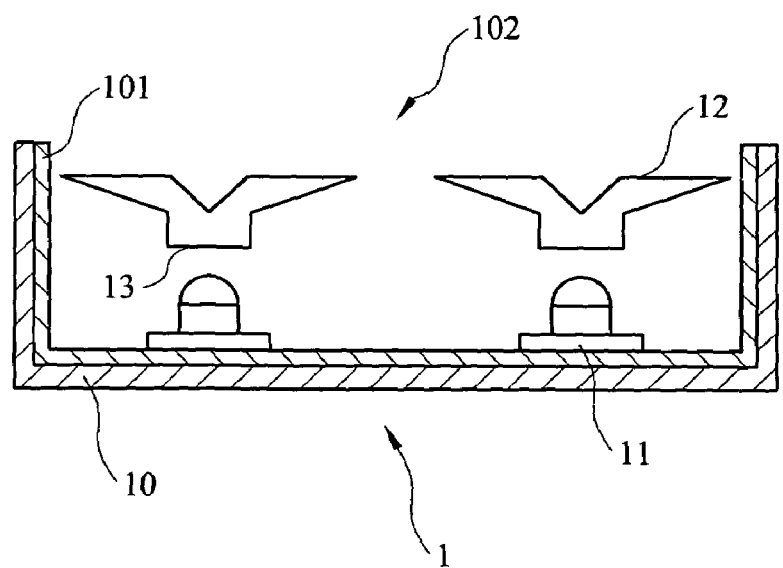
FIG. 1a is a schematic view illustrating an illumination apparatus in accordance with an embodiment of the present invention.
Figure 1B:
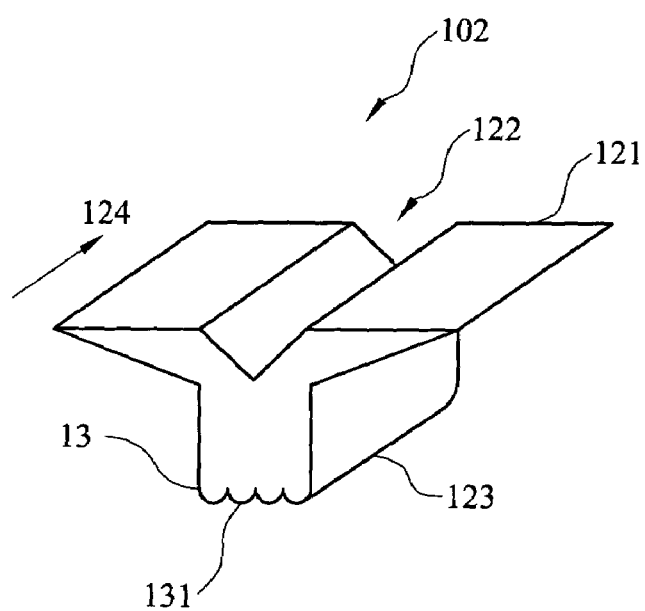
FIG. 1b is a schematic enlarged view illustrating a light-spreading device in the illumination apparatus in accordance with the embodiment of the present invention.

Referring to FIG. 1a and FIG. 1b, FIG. 1a is a schematic view illustrating an illumination apparatus in accordance with an embodiment of the present invention. The illumination apparatus 1 comprises a cavity 10, a light source 11, a light-spreading device 12 and a first optically-conditioning surface 13, wherein the cavity 10 comprises a diffusion surface 101 and a light-output area 102. The diffusion surface 101 is disposed on the interior side of the cavity 10, and the light source 11 emits light for the illumination apparatus 1. The light-spreading device 12 distributes the light emitted from the light source 11 so as to generate a uniform illumination.

When the light (not shown) emitted form the light source 11 strikes the diffusion surface 101, the light is scattered by the surface 101 and possibly uniformly distributed. Preferably, the diffusion surface 101 is substantially similar to a Lambertian surface. An observer viewing from any angle will detect the same intensity of the light scattered by the Lambertian surface, so that the observers cannot distinguish the scattered light from the original one emitted form the light source 11, i.e. the light will uniformly emit to the surroundings. Alternatively, the diffusion surface 101 is possibly substituted by a reflective surface. The cavity 10 is a space confined by a housing forming the illumination apparatus 1; or by another structure, such as a bezel and/or frame of a backlight module, for accommodating the illumination apparatus 1.

The light source 11 includes one or more light-emitting apparatus, and the light-emitting apparatuses emit one or more colored lights. The mixing of the different colored lights may create many colored light different from original ones based on the mixing percentage of each colored light. Preferably, the light source 11 may emit three primary colored lights, that is, red, blue and green lights. Mixing the three primary colors with adjusted percentages can create most of colored lights, including but not limited to white light. The light source 11 can be a point light emitter, a linear light emitter or a planar light emitter, such as an LED, a laser diode (LD), a cold cathode florescent lamp (CCFL), a halogen bulb and an organic LED (OLED), etc. Accordingly, a uniform colored light with less or no distinguished light spots or patterns can be created by properly arranging the light sources 11 under the light-spreading device 12 and adjusting the distance between the light sources 11 and light-spreading device 12 and the distances between each of the light sources 11.

FIG. 1b is a schematic enlarged view illustrating a light-spreading device 12 in the illumination apparatus in accordance with the embodiment of the present invention. The light-spreading device 12 has a wing-shaped protrusion part 121, a recess 122 and a light incident surface 123, wherein the light-spreading device 12 preferably extends in a longitudinal direction 124. The recess 122 is positioned away from the light incident surface 123, and preferably, the recess 122 is positioned on a side opposite to the light incident surface 123. The first optically-conditioning surface 13 has a first wavelike array 131, which makes the colored light more uniformly distributed and thereby prevent distinguished light spots or unmixed colored lights from being viewed by the observer. The light entering through the light incident surface 123 and traveling to the light-spreading device 12 is partially or totally reflected on the interface between the recess 122 and ambient optical medium through total internal reflection and moves to both sides of the recess 122, i.e. to the wing-shaped protrusion part 121. However, part of light may directly leave out the recess 122. Due to the difference of the refractive index between the light-spreading device 12 and ambient optical medium, the light leaving out the outer surface of the light-spreading device 12 may be refracted in compliance with the Snell's law. The portion of light totally reflected on the recess 122 will move to the wing-shaped protrusion part 121, therefore, the flux of the light directly leaving out the recess 122 decreases. Consequently, it prevents the majority of the light emitted from the light sources 11 from leaving out the recess 122 and creating a light spot. Preferably, the volume of the recess 122 is similar to a V-shape or a U-shape, as shown in FIG. 1b. If the recess 122 is in a V-shape, the apex of the recess 122 preferably points to the light incident surface 123. The light reflected on the recess 122 to the wing-shaped protrusion part 121 and/or the light traveling to the wing-shaped protrusion part 121 without being reflected on the recess 122 may leave out the light-spreading device 12 in the ways including but not limited to directly passing, refracting and reflecting. For example, the light incident to the light-spreading device 12 at a specific angle will undergo total internal reflection several times inside the wing-shaped protrusion part 121 so as to gradually mix up and leave out the light-spreading device 12 as well-mixed colored light. Further, the light incident surface 123 includes but not limited to a flat surface, a concaved surface, or any other curved surface capable of receiving light. FIG. 1b illustrates that an upper surface of the wing-shaped protrusion part 121 extends in the longitudinal direction 124, and that the recess 122 is shaped as a recess into an upper surface of the wing-shaped protrusion part 121. Because of this, the light moves from both sides of the recess 122 directly into the wing-shaped protrusion parts 121 disposed on either side of the recess 122, and the flux of the light leaving from the recess decreases, as mentioned above. FIG. 1b also illustrates that the upper surface of the wing-shaped protrusion part 121 extends in a second direction that is perpendicular to the longitudinal direction (the second direction is a left-right direction in FIG. 1b). and the upper surface of the wing-shaped protrusion part is substantially planar as shown. FIG. 1b also illustrates that the light-spreading device 102 is prismatic, that the recess 122 comprises a groove in the planar upper surface, and that the recess 122 extends in the longitudinal direction 124, and that, in addition, each respective wing-shaped protrusion part 121 comprises a respective planar lower surface making an angle to the planar upper surface and meeting the planar upper surface at a respective edge extending in the longitudinal direction 124.

In the present invention, a first optically-conditioning surface 13 is optionally used to spread the light. As shown in FIG. 1b, the first optically-conditioning surface 13 has a first wavelike array 131. In the present embodiment, the first optically-conditioning surface 13 and the first wavelike array 131 are formed on the light incident surface 123 of the light-spreading device 12. The first wavelike array 131 is a wave-shaped surface formed on the first optically-conditioning surface 13, and the wave-shaped surface is formed in a predetermined wave direction, i.e. the array direction of the first wavelike array 131. The first wavelike array 131 may be consisted of a plurality of micro-lenses. While passing through the first optically-conditioning surface 13, the light will be redirected and blurred by the micro-lenses of the first wavelike array 131. A diameter of the micro-lens is about between 50 μm and 60 μm. When the waves of the first wavelike array 131 are constructed consecutively, a distance between two consecutive wave peaks or troughs is about between 100 μm and 120 μm.

Further, the first optically-conditioning surface 13 also can be formed inside the light-spreading device 12 by forming the wavelike array on a bonding interface of two materials with different refractive indexes. The first wavelike array 131 is not limited to being formed on the light incident surface 123, but also can be formed on the wing-shaped protrusion part 121 or/and the recess 122, i.e. the first wavelike array 131 can be formed on the any path through which the light possibly passes.

The material of the light-spreading device 12 includes but not limited to acrylic resin, COC, PMMA, PC, PC/PMMA, Polyetherimide, fluorocarbon polymer, silicone, equivalents thereof, combinations thereof, and any other transparent materials.

Second Embodiment

Figure 2A:
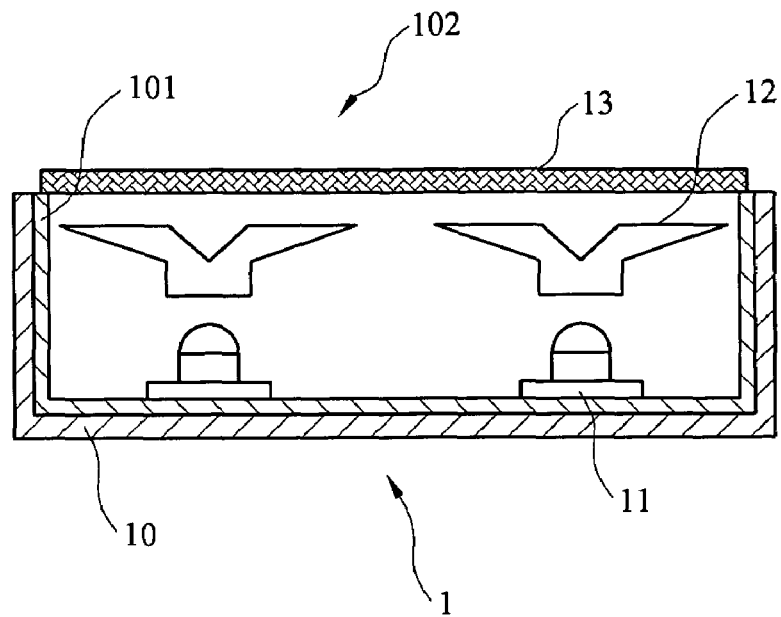
FIG. 2a is a schematic view illustrating an illumination apparatus in accordance with another embodiment of the present invention.
Figure 2B:
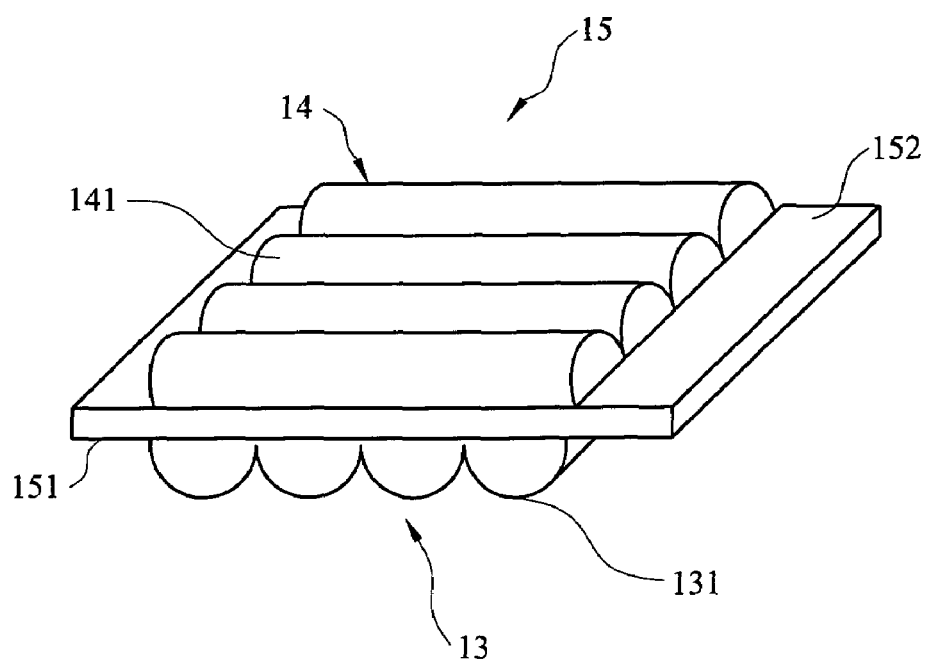
FIG. 2b is a schematic enlarged view illustrating an optical film in the illumination apparatus in accordance with another embodiment of the present invention.

FIGS. 2a and 2b are schematic views illustrating an illumination apparatus in accordance with another embodiment of the present invention. It is noted that, in the second embodiment, the same references numbers are used for similar elements and are not described in detail again.

The illumination apparatus 1 optionally comprises an optical film 15 having a first surface 151 and a second surface 152 opposite to the first surface 151. The optically-conditioning surface 13 of the present embodiment is formed on the first surface 151 The optical film 15 can be disposed on the light-output area 102 of the illumination apparatus 1 or between the light-spreading device 12 and the light source 11. As described in the first embodiment, the optical film 15 is able to spread light. Optionally, a second optically-conditioning surface 14 can be formed on the second surface 152 of the optical film 15, and a second wavelike array 141 is also formed on the second optically-conditioning surface 14. The array direction of the first wavelike array 131 is different from that of the second wavelike array 141. As shown in FIG. 2b, a Moiré pattern is formed by stacking the first wavelike array 131 and the second wavelike array 141 at different array directions. By properly adjusting the first wavelike array 131 and the second wavelike array 141, the light passing through the Moiré pattern can be re-distributed. The optical film 15 is available from the product manufactured by S-Light Opt Electronics Inc., Taiwan. In order to further enhance the light-spreading performance, one or more diffuser can be positioned over the optical film 15.

The first optically-conditioning surface 13 can be formed on one of the light-spreading device 12 and the optical film 15, or both of them. The first wavelike array 131 and the second wavelike array 141 can have the same or different wave sizes (micro-lens sizes), wave shapes and wave frequencies, which depends on the type of the light source and the illumination requirements of the illumination apparatus 1.

Third Embodiment

Figure 3A:
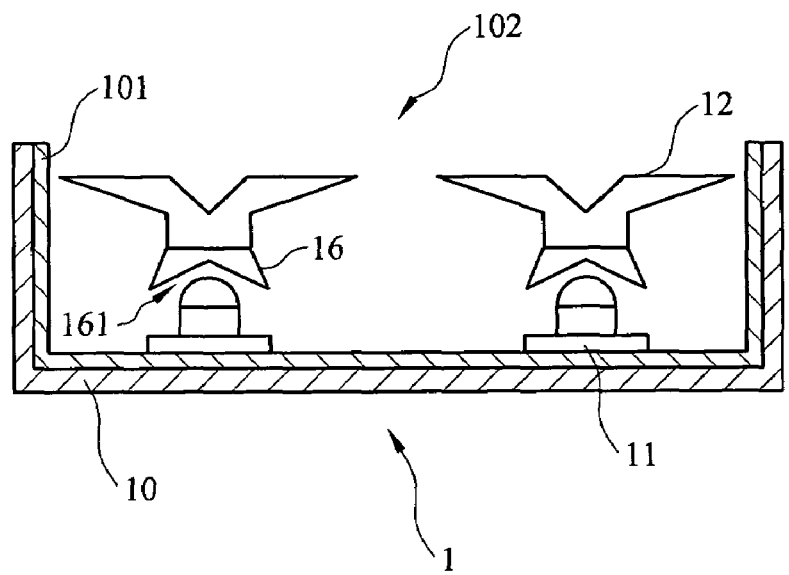
FIG. 3a and FIG. 3b are schematic views respectively illustrating an illumination apparatus in accordance with still another embodiment of the present invention.
Figure 3B:
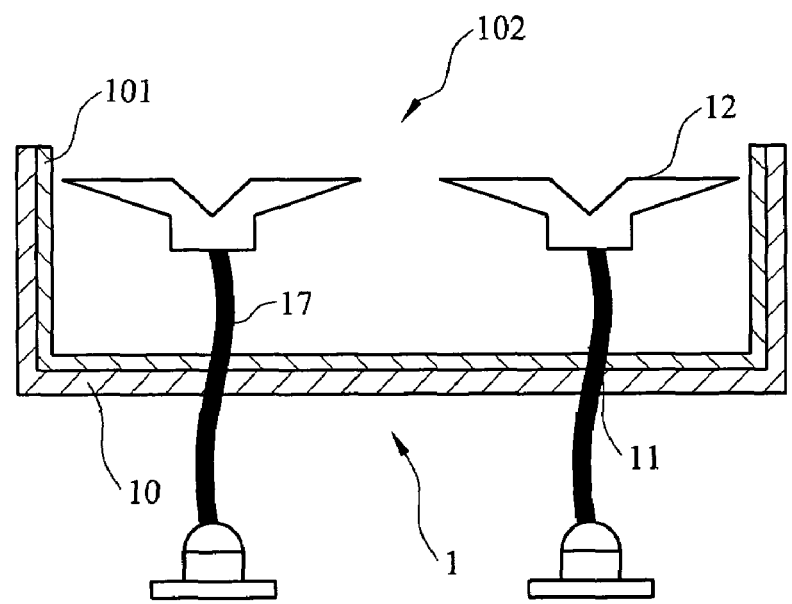

FIGS. 3a and 3b are schematic view illustrating an illumination apparatus in accordance with another embodiment of the present invention. In the third embodiment, the same references numbers are used for similar elements in the first embodiment and are not described in detail again.

The light emitted from the light source 11 usually will not travel in one direction but radiate into the surroundings, therefore, it is likely that a portion of the light will directly enter the cavity 10 without passing through the light-spreading device 12. To collect the light not entering into the light-spreading device 12, the illumination apparatus 1 of the present invention includes a light-collecting element 16 for collecting the light emitted from the light source 11. The light-collecting element 16 is positioned between the light source 11 and the light-spreading device 12. Furthermore, the first optically-conditioning surface 13 can be formed on the light-collecting element 16. When the first optically-conditioning surface 13 is formed on one side of the light-collecting element 16, which faces the light source 11, the other side of the light-collecting element 16 can be directly attached to the light-spreading device 12. The light-collecting element 16 and the light-spreading device 12 can be formed as a whole. Alternatively, the first optically-conditioning surface 13 can be formed on one side of the light-collecting element 16, which faces the light-spreading device 12. The light-collecting element 16 may have a trench 161 for adapting the light source 11, therefore, most of light emitted from the light source 11 may enter the light-collecting element 16.

The light source 11 of the illumination apparatus 1 is not limited to being disposed inside the cavity 10, but also can be disposed outside the cavity 10. When the light source 11 is disposed outside the cavity 10, a light-transmitting element 17 can be used to transmit the light emitted from the light source 11 to the light-spreading device 12. The light-transmitting element 17 can be such as an optical fiber, a light pipe and equivalents thereof. One end of the light-transmitting element 17 can be connected to the light-collecting element 16. Both of the light-transmitting element 17 and the light source 11 can be installed inside the cavity. If the light-transmitting element 17 is flexible, the light source 11 can be positioned in other places where the light-transmitting element 17 can reach.

Fourth Embodiment

Figure 4A:
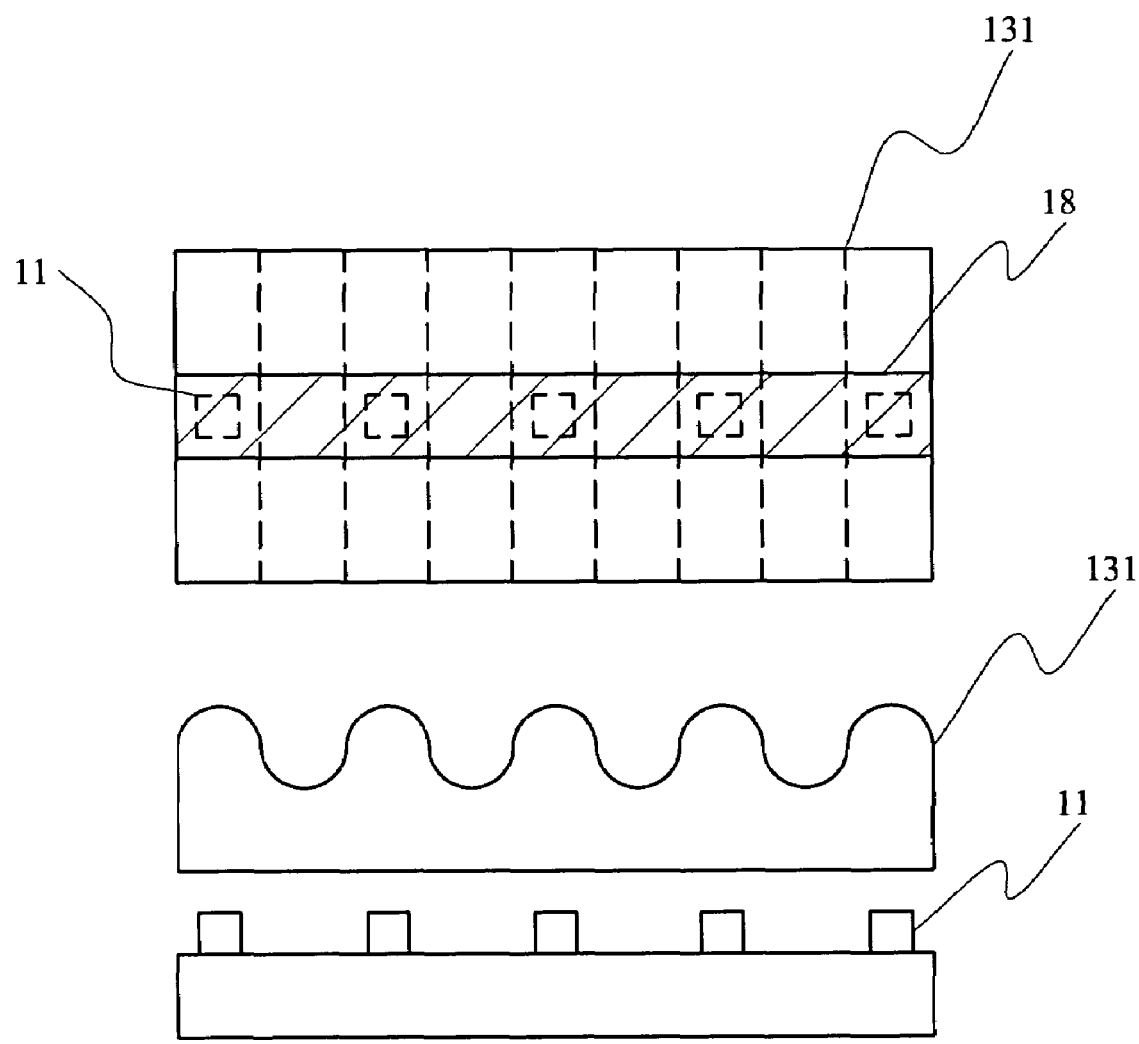
FIG. 4a to FIG. 4c are schematic views each illustrating the allocation of a wavelike array and a light source in accordance with an embodiment of the present invention.
Figure 4B:
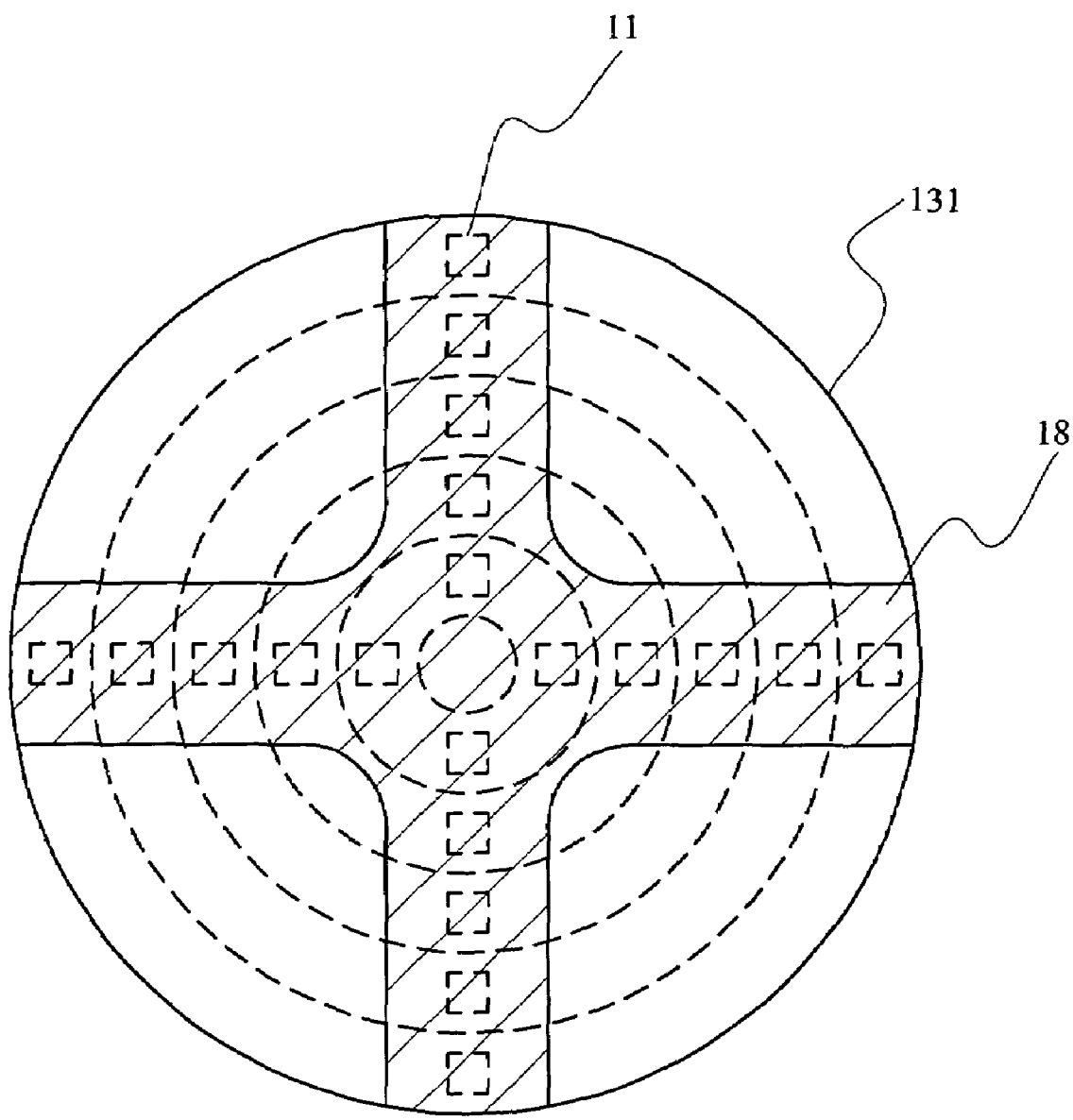
Figure 4C:
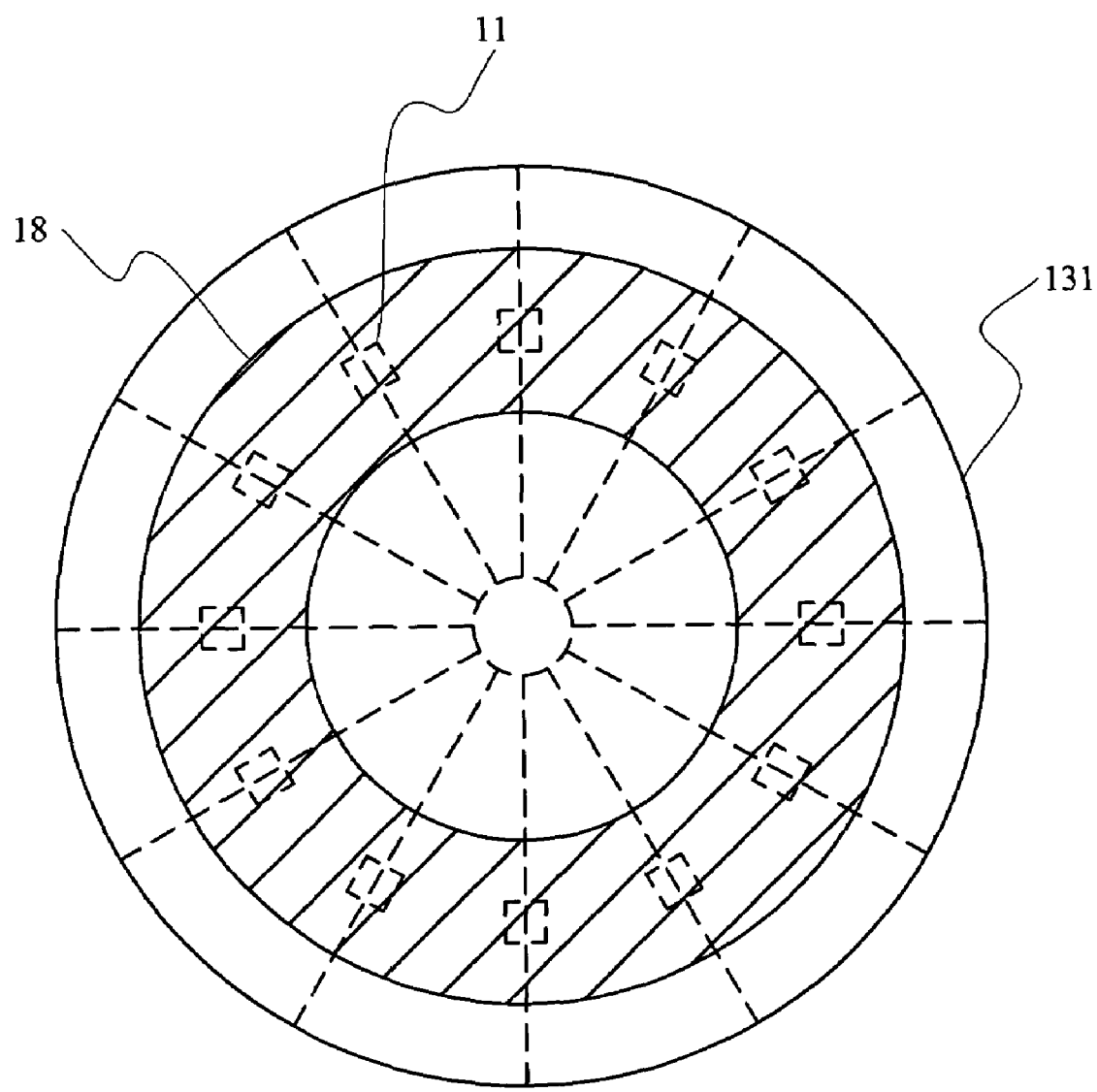

If the arrangement direction of the light source 11 is parallel to the array direction of the first wavelike array 131 (i.e. the wavefront direction of the wavelike array), a light pattern 18 substantially parallel to the wavefront direction of the first wavelike array 131 will be formed after the light passing through the first wavelike array 131. Hence, when the arrangement direction of the light source 11 and the wavefront direction of the first wavelike array 131 are arranged in a linear pattern, the light will be distributed as a linear pattern; when the arrangement direction of the light source 11 and the wavefront direction of the first wavelike array 131 are arranged in a curved pattern or in a radiating pattern, the light will be distributed as a curved pattern or a radiating pattern, as shown in FIGS. 4*a* to 4*c*. Theoretically, when the arrangement direction of the light source 11 is parallel or about parallel to the wavefront direction of the first wavelike array 131, the light from the light source 11 will be distributed into the light pattern 18 extending along the wavefront direction. It is noted that the scale of the light source 11 to the first wavelike array 131 shown in FIGS. 4*a* to 4*c* is exaggerated and does not reflect the real one.

The second wavelike array 141 further can be formed above the first wavelike array 131, such as shown in FIG. 2*b*. If the wavefront direction of the second wavelike array 141 is different from that of the first wavelike array 131, the light can be distributed in different directions. For example, when the wavefront direction of the first wavelike array 131 is perpendicular to that of the second wavelike array 141 and the light source 11 is linearly arranged, the light is firstly distributed as a linear pattern after passing through the first wavelike array 131, and then is distributed as a planar pattern after passing through the second wavelike array 131.

Figure 5:
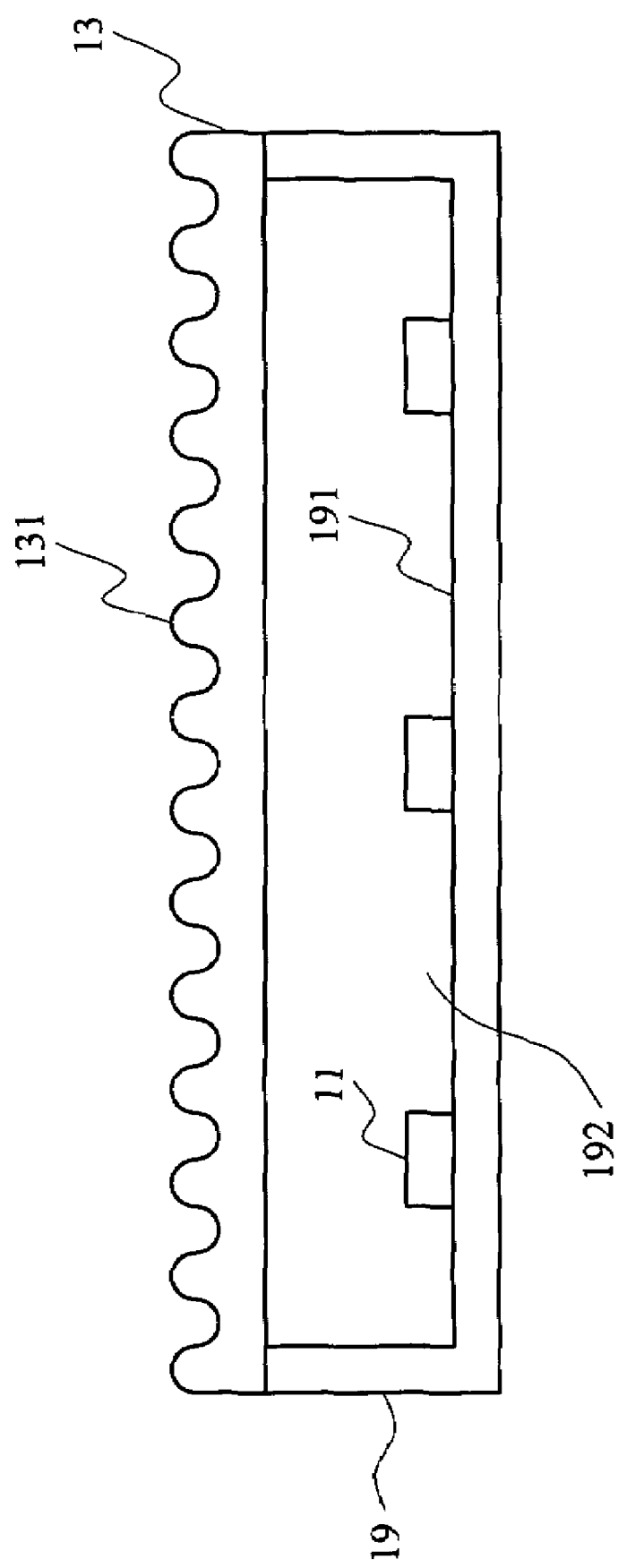
FIG. 5 is a schematic view illustrating the structure of an illumination apparatus in accordance with yet another embodiment of the present invention.

Referring to FIG. 5, with the use of the light source 11 and the first wavelike array 131, the point sources can achieve a function similar to a linear light source, such as a CCFL or fluorescent light. For example, a plurality of point sources, which serve as the light sources 11, is placed in a recessed cavity 19, and the first wavelike array 13 is disposed above the light sources 11. If the arrangement direction of the light sources 11 and the wavefront direction of the first wavelike array 131 are arranged in a linear pattern and are parallel to each other, the light from the light source 11 will be distributed as a linear pattern. By designing necessary circuit and mechanical components, an illumination apparatus similar to CCFL or fluorescent light can be formed. Moreover a reflective surface 191 can be formed inside the recessed cavity 19 for reflecting light emitted from the light source 11.

The first wavelike array 131 can be formed on a material, such as resin, filled in the recessed cavity 19. The first wavelike array 131 also can be formed on an optical film 13 covering the light source 11. For alleviating the thermal stress induced by the heat generated from the light source 11, a filling material 192 can be filled between the optical film 13 and the light source 11, wherein the thermal expansion coefficient of the filling material 19 is different from that of the optical film 13.

The various exemplified illumination apparatuses 1 described above can be used in a backlight module for an LCD or illumination. When the backlight module is a direct light type, the backlight module at least comprises the light source 11 and the first wavelike array 131. Preferably, the arrangement direction of the light source 11 is substantially parallel to the wavefront direction of the first wavelike array 131. Optionally, the light-spreading device 12 can be disposed between the light source 11 and the liquid-crystal layer of the LCD for distributing light. When the backlight module is an edge light type, a light guide plate has to be used to direct light to the displaying surface of the LCD. In this case, the light source 11 is disposed on the lateral side of the light guide plate. To form a linear light pattern, such as the one generated by CCFL, the wavefront direction of the first wavelike array 13 is arranged to be parallel to the arrangement direction of the light source 11. The first wavelike array 131 may be assembled with the light source 11 as a module, such as shown in FIG. 5. The first wavelike array 131 may be directly formed on the light guide plate, such as on the light-entering area (not shown) of the light guiding plate. The light emitted from the light source 11 can be re-directed to the light guide plate via the light-spreading device 12, wherein the wing-shaped protrusion part 121 of the light-spreading device 12 faces the light guide plate.

As is understood by a person skilled in the art, the foregoing preferred embodiments of the present invention are for illustrating the present invention rather than for limiting the present invention. It is intended to cover various modifications and similar arrangements included within the spirit and scope of the appended claims, the scope of which should be accorded the broadest interpretation so as to encompass all such modifications and similar structures.

What is claimed is:

1. An illumination apparatus, comprising:
a cavity having a diffusion surface and a light-output area;
at least one light source for emitting a light;
a light-spreading device disposed in the cavity, and having a wing-shaped protrusion part, a light incident surface, and a recess located away from the light incident surface, for substantially guiding the light towards the wing-shaped protrusion part; and
a first optically-conditioning surface located on the path of the light and having a first wavelike array.

2. The illumination apparatus of claim 1, wherein the diffusion surface is substantially a Lambertian surface and the light-spreading device is longitudinally shaped.

3. The illumination apparatus of claim 1, further comprising: an optical film comprising a first surface and a second surface opposite to the first surface, wherein the first optically-conditioning surface is formed on the first surface.

4. The illumination apparatus of claim 3, wherein the optical film further comprising: a second optically-conditioning surface formed on the second surface and having a second wavelike array extending in an array direction different from that of the first wavelike array.

5. The illumination apparatus of claim 3, wherein the optical film is disposed on the light-output area.

6. The illumination apparatus of claim 3, wherein the optical film is located between the light-spreading device and the light source.

7. The illumination apparatus of claim 1, wherein the first optically-conditioning surface is formed on the light incident surface.

8. The illumination apparatus of claim 1, wherein the first optically-conditioning surface is formed on the light-spreading device.

9. The illumination apparatus of claim 8, wherein the light-spreading device comprises two kinds of materials having different refractive indexes.

10. The illumination apparatus of claim 1, further comprising: a light-collecting element located between the light source and the light-spreading device for collecting the light, wherein the first optically-conditioning surface is formed on the light-collecting element.

11. The illumination apparatus of claim 10, wherein the first optically-conditioning surface faces the light source.

12. The illumination apparatus of claim 10, wherein the first optically-conditioning surface faces the light-spreading device.

13. The illumination apparatus of claim 10, wherein the light-spreading device and the light-collecting element are integrally formed.

14. The illumination apparatus of claim 10, wherein the light-collecting element comprises a trench for accommodating the light source.

15. The illumination apparatus of claim 1, further comprising: a light-transmitting element for transmitting the light to the light-spreading device.

16. The illumination apparatus of claim 15, wherein the light-transmitting element is selected from a group consisting of an optical fiber device, a light pipe, and equivalents thereof.

17. The illumination apparatus of claim 1, wherein the recess is substantially in a V-shape.

18. The illumination apparatus of claim 1, wherein the recess is substantially in a U-shape.

19. The illumination apparatus of claim 1, wherein the light source is a point light emitter.

20. The illumination apparatus of claim 1, wherein the light source is a semiconductor light-emitting device.

21. The illumination apparatus of claim 1, wherein the light source comprises a plurality of light-emitting devices, and at least two of the light-emitting devices emit lights of different colors.

22. The illumination apparatus of claim 1, wherein the light source emits white light.

23. The illumination apparatus of claim 1, wherein a material of the light-spreading device is selected from a group consisting of acrylic resin, COC, PMMA, PC, PC/PMMA, Polyetherimide, fluorocarbon polymer, silicone, and equivalents or/and combinations thereof.

24. The illumination apparatus of claim 1, wherein
an upper surface of the wing-shaped protrusion part extends in a longitudinal direction and the recess is shaped as a recess into the upper surface of the wing-shaped protrusion part,
whereby light entering through the light incident surface is reflected by total internal reflection from an interface between the recess and an ambient optical medium and
the light moves from sides of the recess directly into the wing-shaped protrusion part, whereby flux of the light leaving from the recess decreases.

25. The illumination apparatus of claim 24, wherein the recess comprises an apex pointing to the light incident surface.

26. The illumination apparatus of claim 24, wherein the upper surface of the wing-shaped protrusion part extends in a second direction perpendicular to the longitudinal direction, whereby the upper surface of the wing-shaped protrusion part is planar.

27. The illumination apparatus of claim 26, wherein the light-spreading device is prismatic, the recess comprises a groove in the planar upper surface, and the recess extends in the longitudinal direction.

28. The illumination apparatus of claim 27, wherein a respective wing-shaped protrusion part is disposed on each side of the groove.

29. The illumination apparatus of claim 28, wherein each respective wing-shaped protrusion part comprises a respective planar lower surface making a respective angle to the planar upper surface and meeting the planar upper surface at a respective edge extending in the longitudinal direction.

30. A light-spreading device, comprising:
a wing-shaped protrusion part;
a light incident surface;
a recess located away from the light incident surface; and
an optically-conditioning surface comprising a wavelike array formed in a wavefront direction;
wherein the wing-shaped protrusion part comprises an upper surface thereof which extends in a longitudinal direction, and
wherein the recess is shaped as a recess into the upper surface of the wing-shaped protrusion part,
whereby light entering through the light incident surface is reflected by total internal reflection from an interface between the recess and an ambient optical medium and
the light moves from sides of the recess directly into the wing-shaped protrusion part, whereby flux of the light leaving from the recess decreases.

31. The light-spreading device of claim 30, wherein the optically-conditioning surface is formed on the light incident surface.

32. The light-spreading device of claim 30, wherein the optically-conditioning surface is formed on the recess.

33. The light-spreading device of claim 30, wherein the optically-conditioning surface is formed on the wing-shaped protrusion part.

34. The light-spreading device of claim 30, wherein the wing-shaped protrusion part comprises a reflective surface.

35. The light-spreading device of claim 30, wherein the wing-shaped protrusion part comprises a refractive surface.

36. The light-spreading device of claim 30, wherein the recess comprises an apex pointing to the light incident surface.

37. The light-spreading device of claim 30, wherein the recess reflects light.

38. The light-spreading device of claim 30, wherein the wavefront direction is substantially parallel to the longitudinal direction.

39. The light-spreading device of claim 30, wherein the optically-conditioning surface is located between two kinds of materials having different refractive indexes.

40. The light-spreading device of claim 30, wherein the upper surface of the wing-shaped protrusion part extends in a second direction perpendicular to the longitudinal direction, whereby the upper surface of the wing-shaped protrusion part is planar.

41. The light-spreading device of claim 40, wherein the light-spreading device is prismatic, the recess comprises a groove in the planar upper surface, and the recess extends in the longitudinal direction.

42. The light-spreading device of claim 41, wherein a respective wing-shaped protrusion part is disposed on each side of the groove.

43. The light-spreading device of claim 42, wherein each respective wing-shaped protrusion part comprises a respective planar lower surface making a respective angle to the planar upper surface and meeting the planar upper surface at a respective edge extending in the longitudinal direction.

* * * * *